United States Patent
Yin et al.

(10) Patent No.: US 10,139,667 B2
(45) Date of Patent: Nov. 27, 2018

(54) COLOR FILTER SUBSTRATE PROVIDED WITH INORGANIC COVER LAYER AND DISPLAY PANEL COMPRISING SAME

(71) Applicants: BOE Technology Group Co., Ltd., Beijing (CN); Hefei Xinsheng Optoelectronics Technology Co., Ltd., Anhui (CN)

(72) Inventors: Haibin Yin, Beijing (CN); Sang Man Yuk, Beijing (CN); Bin Li, Beijing (CN); Wenhao Tang, Beijing (CN); Tao Zhu, Beijing (CN); Qun Fang, Beijing (CN); Huifang Yuan, Beijing (CN); Anxin Dong, Beijing (CN); Jian Chen, Beijing (CN); Guoqiang Zhong, Beijing (CN); Xinxin Fu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/098,523

(22) Filed: Apr. 14, 2016

(65) Prior Publication Data
US 2017/0045777 A1 Feb. 16, 2017

(30) Foreign Application Priority Data

Aug. 11, 2015 (CN) .......................... 2015 1 0490396

(51) Int. Cl.
*G02F 1/1335* (2006.01)
*H01L 27/12* (2006.01)
(Continued)

(52) U.S. Cl.
CPC ....... *G02F 1/133516* (2013.01); *G02B 5/201* (2013.01); *H01L 27/124* (2013.01);
(Continued)

(58) Field of Classification Search
CPC ............. G02F 1/133516; G02F 1/1335; G02F 1/1337; G02B 5/201; H01L 27/1218; H01L 27/124; H05B 33/00
(Continued)

(56) References Cited

U.S. PATENT DOCUMENTS 5,605,847 A * 2/1997 Zhang ............... G02F 1/136209
257/E21.413
6,509,948 B2 * 1/2003 Suzuki ................ G02F 1/13394
349/106

(Continued)

FOREIGN PATENT DOCUMENTS

CN 101765869 A 6/2010
CN 101963720 A 2/2011
(Continued)

OTHER PUBLICATIONS

Sep. 4, 2017—(CN) Office Action application 201510490396.7 with English Translation.

*Primary Examiner* — Mouloucoulaye Inoussa
(74) *Attorney, Agent, or Firm* — Banner & Witcoff, Ltd.

(57) ABSTRACT

Provided are a color filter substrate provided with an inorganic cover layer and a display panel including the same. The color filter (CF) substrate includes a base substrate; a black matrix and a pixel resin layer both formed on the base substrate; a planarization layer formed on the black matrix and the pixel resin layer; and an inorganic cover layer formed on the planarization layer.

15 Claims, 4 Drawing Sheets

(51) Int. Cl.
*G02B 5/20* (2006.01)
*G02F 1/1333* (2006.01)

(52) U.S. Cl.
CPC .............. *H01L 27/1218* (2013.01); *G02F 2001/133397* (2013.01); *G02F 2001/133519* (2013.01)

(58) Field of Classification Search
USPC .......... 349/124, 106, 107, 110; 438/30, 70; 428/690, 917, 212; 313/504, 506, 512, 313/112; 257/98
See application file for complete search history.

(56) References Cited

U.S. PATENT DOCUMENTS

| | | | | |
|---|---|---|---|---|
| 6,850,290 B1* | 2/2005 | Song | ..................... | G02F 1/1368 349/106 |
| 2003/0063238 A1* | 4/2003 | Yi | ..................... | G02B 5/201 349/106 |
| 2004/0106240 A1* | 6/2004 | Peng | ................. | H01L 29/66757 438/166 |
| 2004/0201806 A1* | 10/2004 | Choo | ................. | G02F 1/133753 349/129 |
| 2005/0084708 A1* | 4/2005 | Haoto | ................. | H01L 51/5256 428/690 |
| 2005/0088598 A1* | 4/2005 | Matsumori | ....... | G02F 1/133553 349/139 |
| 2007/0013846 A1* | 1/2007 | Rho | .................... | G02F 1/13378 349/124 |
| 2008/0030672 A1* | 2/2008 | Lee | ....................... | G02F 1/1337 349/191 |
| 2008/0123036 A1* | 5/2008 | Sasaki | ................. | G02F 1/13378 349/124 |
| 2010/0237362 A1 | 9/2010 | Okabe | | |
| 2010/0328590 A1* | 12/2010 | Huang | .................... | C09D 5/24 349/113 |
| 2015/0370106 A1* | 12/2015 | Kitahara | ........... | G02F 1/133734 349/123 |

FOREIGN PATENT DOCUMENTS

| | | |
|---|---|---|
| CN | 103412439 A | 11/2013 |
| JP | 2005221957 A | 8/2005 |
| JP | 2006106503 A | 4/2006 |

\* cited by examiner

COLOR FILTER SUBSTRATE PROVIDED WITH INORGANIC COVER LAYER AND DISPLAY PANEL COMPRISING SAME

This application claims priority to and the benefit of Chinese Patent Application No. 201510490396.7 filed on Aug. 11, 2015, which application is incorporated herein in its entirety.

TECHNICAL FIELD

Embodiments of the present disclosure relate to a color filter substrate provided with an inorganic cover layer, a method for producing the same, and a display panel comprising the color filter substrate.

BACKGROUND

In a display panel or display apparatus, a color filter substrate is usually required to be used to filter the light emitted therefrom. The color filter substrate is very important for improving the display quality or improving the production efficiency of the display panel or display apparatus.

SUMMARY

An embodiment of the present disclosure provides a color filter (CF) substrate, which comprises a first base substrate; a black matrix and a pixel resin layer both formed on the first base substrate; a first planarization layer formed on the black matrix and the pixel resin layer; and a first inorganic cover layer formed on the first planarization layer. The first inorganic cover layer can effectively prevent gas releasing from the pixel resin layer and the first planarization layer, thereby reducing the evacuation time during the cell-assembling process when producing the display panel and improving the cell-assembling efficiency.

In some embodiments, the first inorganic cover layer is made of an inorganic nonmetallic material. In some embodiments, the inorganic nonmetallic material is selected from the group consisting of oxides or nitrides of metals or nonmetals.

In some embodiments, the first inorganic cover layer comprises at least one selected from the group consisting of amorphous silicon layer, polysilicon layer, $SiN_x$ layer, $SiO_2$ layer, $SiN_yO_z$ layer and the combination thereof.

In some embodiments, the first inorganic cover layer has a thickness of 50-1000 nm, for example 200-800 nm or 400-600 nm.

In some embodiments, the $SiN_x$ layer has a density of 3.2-3.5 $g/cm^3$.

In some embodiments, the $SiO_2$ layer has a density of 2.0-2.4 $g/cm^3$.

In some embodiments, the pixel resin layer comprises a red pixel resin layer, a green pixel resin layer, a blue pixel resin layer and optionally a transparent pixel resin layer.

In some embodiments, the first planarization layer is made of a acrylic resin.

In some embodiments, the CF substrate further comprises a common electrode formed on the first inorganic cover layer.

In some embodiments, the CF substrate further comprises a columnar spacer formed on the first inorganic cover layer.

An embodiment of the present disclosure further provides a display panel, which comprises an array substrate and a color filter (CF) substrate, wherein, the CF substrate com-

2 prises a first base substrate; a black matrix and a pixel resin layer both formed on the first base substrate; a first planarization layer formed on the black matrix and the pixel resin layer; and a first inorganic cover layer formed on the first planarization layer.

In some embodiments, the array substrate comprises: a second base substrate; a switch element arranged on the second base substrate; a second planarization layer arranged on the switch element; a second inorganic cover layer arranged on the second planarization layer; and an electrode arranged on the second inorganic cover layer.

In some embodiments, the electrode arranged on the second inorganic cover layer comprises at least one selected from the group consisting of a common electrode and a pixel electrode. In this case, the CF substrate may be provided with or without electrodes.

In some embodiments, the electrode arranged on the second inorganic cover layer comprises a pixel electrode, and the CF substrate further comprises a common electrode arranged on the first inorganic cover layer.

In some embodiments, each of the first inorganic cover layer and the second inorganic cover layer is independently made of an inorganic nonmetallic material. In some embodiments, the inorganic nonmetallic material is selected from the group consisting of oxides or nitrides of metals or nonmetals.

In some embodiments, each of the first inorganic cover layer and the second inorganic cover layer comprises independently at least one selected from the group consisting of: Si layer, $SiN_x$ layer, $SiO_2$ layer, $SiN_yO_z$ layer or the combination thereof. In some embodiments, the $SiN_x$ layer has a density of 3.2-3.5 $g/cm^3$. In some embodiments, the $SiO_2$ layer has a density of 2.0-2.4 $g/cm^3$.

In some embodiments, each of the first inorganic cover layer and the second inorganic cover layer independently has a density of 50-1000 nm, for example 200-800 nm or 400-600 nm.

An embodiment of the present disclosure further provides a method for producing a color filter (CF) substrate. The method comprises: forming the black matrix (BM) on the first base substrate; forming the pixel resin layer between the black matrix; forming the first planarization layer on the pixel resin layer; and forming the first inorganic cover layer on the first planarization layer.

In some embodiments, the first inorganic cover layer is formed by any one of the following procedures:
  a. depositing an amorphous silicon layer of a thickness of 50-1000 nm, and converting all or at least a part of the amorphous silicon layer into a polysilicon layer; and
  b. depositing an amorphous silicon layer of a thickness of 50-1000 nm, and converting all or at least a part of the amorphous silicon layer into a $SiO_2$ layer, $SiN_x$ layer and/or $SiN_yO_z$ layer.

BRIEF DESCRIPTION OF THE DRAWINGS

In order to illustrate the technical solutions of the embodiments of the present disclosure more clearly, the figures of the embodiments are briefly described below. Apparently, the figures described below merely relate to some embodiments of the present disclosure rather than are limitative of the present disclosure.

REFERENCE SIGNS

100—color filter (CF) substrate; 200—array substrate; 1—first base substrate; 2—black matrix; 3—pixel resin layer; 4—first planarization layer; 5—first inorganic cover layer; 6—columnar spacer; 7—common electrode; 20—second base substrate; 21—switch element (TFT); 22—second planarization layer; 23—second inorganic cover layer; 24—pixel electrode.

DETAILED DESCRIPTION

To make the object, technical solutions, and advantages of the embodiments of the present disclosure clearer, the technical solutions of the embodiments of the present disclosure will be described below in a clearer and more complete way with reference to the figures of the embodiments of the present disclosure. Apparently, the embodiments described are only part, rather than all of the embodiments of the present disclosure. Based on the embodiments of the present disclosure described, all the other embodiments obtained by a person of ordinary skills in the art without paying inventive work fall into the scope of protection of the present disclosure.

Figure 1:
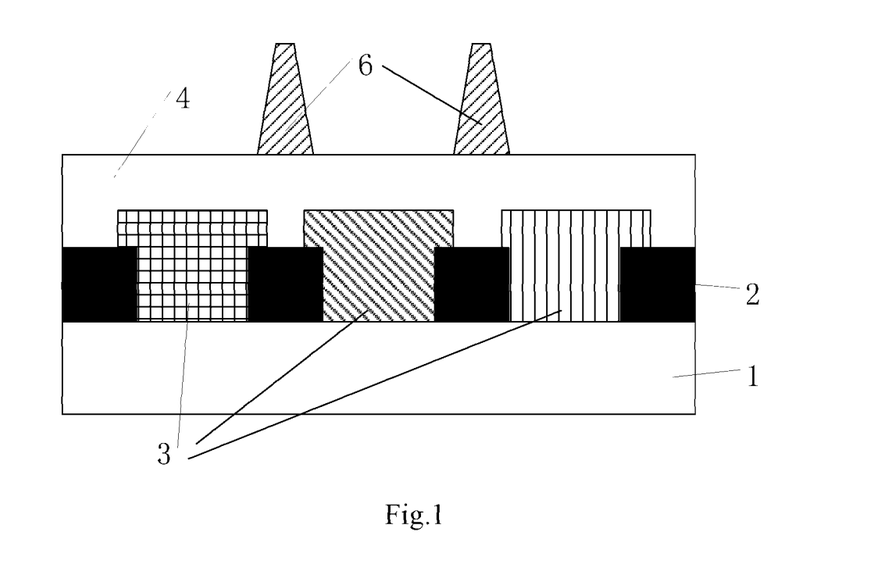
FIG. 1 is a schematic view of an exemplified color filter substrate.

FIG. 1 shows a structural schematic view of a color filter (CF) substrate of a liquid crystal display device. The CF substrate comprises: a black matrix 2 and a pixel resin layer 3 both formed on the first base substrate 1; a first planarization layer 4 formed on the black matrix 2 and the pixel resin layer 3; and a spacer 6 formed on the first planarization layer 4. The first planarization layer 4 is used mainly for reducing the stage difference of the pixel resin layer 3. The first planarization layer 4 may be made of a transparent organic resin material. However, the first planarization layer 4 and the pixel resin layer 3 may release gases synchronously. The released gases may increase the evacuation time during the cell-assembling process and greatly influence the cell-assembling efficiency. Meanwhile, when more gases are released, the gases may finally remain inside the liquid crystal cell, which may aggravate the occurrence of afterimages in the display device and increase the amount of air bubbles at the four corners of the display device. Therefore the liquid crystals tend to be polluted such that Zara defects (point defects) arise. In some embodiments, the color filter (CF) substrate of a liquid crystal display device as shown in FIG. 1 is used for producing a display panel, in which case the evacuation time is 65-70 s by using an ODF (One Drop Fill) device (service condition: 1.0 Pa/30 s, the following are the same) during cell-assembling. In the present application, the evacuation time, by using the ODF (One Drop Fill) device at the condition of 1.0 Pa/30 s, is used for assessing the cell-assembling efficiency.

Figure 2:
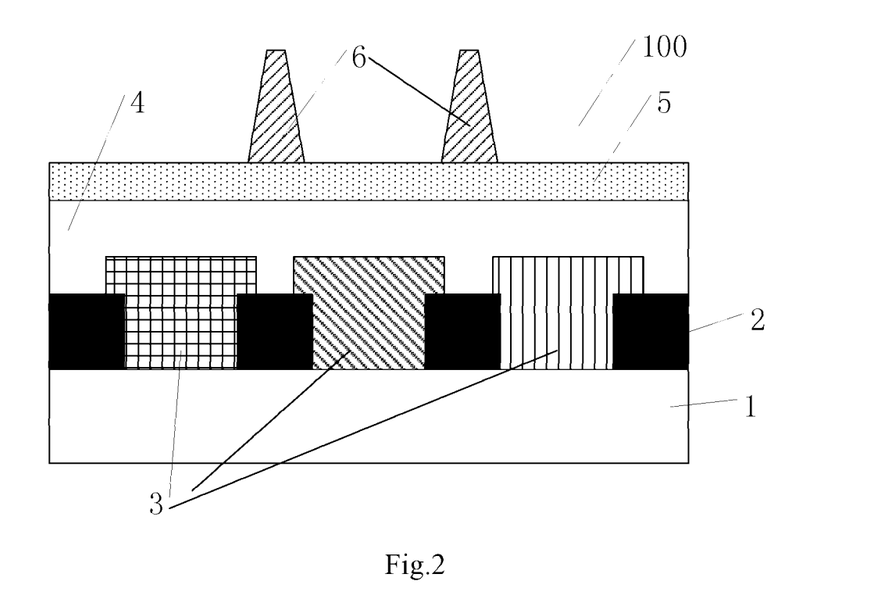
FIG. 2 is a schematic view of a color filter substrate according to an embodiment of the present disclosure.

An embodiment of the present disclosure, as shown in FIG. 2, relates to a color filter (CF) substrate 100, which comprises a first base substrate 1; a black matrix 2 and a pixel resin layer 3 both formed on the first base substrate 1; a first planarization layer 4 formed on the black matrix 2 and the pixel resin layer 3; and a first inorganic cover layer 5 formed on the first planarization layer 4. In some embodiments, the first inorganic cover layer is an inorganic PVX layer (passivation layer). The PVX layer is made of an inorganic nonmetal material or oxides or nitrides of metals or nonmetals. The method for producing the PVX layer may be those methods known in prior art. In some embodiments, a method is used for producing a dense PVX layer. The first inorganic cover layer can effectively prevent gas releasing from the pixel resin layer 3 and the first planarization layer 4, thereby reducing the evacuation time during the cell-assembling process when producing the display panel and improving the cell-assembling efficiency. Meanwhile, the gases remained inside the liquid crystal cell will be reduced, thereby reducing the occurrence of afterimages in the display device and decreasing the amount of air bubbles at the four corners of the display device. Furthermore, the possibility of the contamination of the liquid crystals is decreased, thereby decreasing the possibility of the occurrence of Zara defects (point defects). Herein, the remained gases mainly refer to unpolymerized micromolecular monomers remained in organic resin material, organic solvent, water, etc., and these gases are also referred to as micromolecular gases in the present application. In some embodiments, the color filter (CF) substrate as shown in FIG. 2 is used for producing a display panel of a liquid crystal display device, in which case the evacuation time is 34-58 s by using an ODF (One Drop Fill) device (service condition: 1.0 Pa/30 s) during cell-assembling. In the present application, the evacuation time by using the ODF (One Drop Fill) device at the condition of 1.0 Pa/30 s is used for assessing the cell-assembling efficiency, and correspondingly assessing the capacity of an inorganic cover layer for preventing the escape of micromolecular gases.

An embodiment of the present disclosure relates to a method for producing a color filter (CF) substrate 100. The CF substrate comprises a first base substrate 1; a black matrix (BM) 2 and a pixel resin layer 3 both formed on the first base substrate 1; a first planarization layer 4 formed on the black matrix 2 and the pixel resin layer 3; and a first inorganic cover layer 5 formed on the first planarization layer 4. The method comprises: forming the black matrix (BM) 2 on the first base substrate 1; forming the pixel resin layer 3 between the black matrix 2; forming the first planarization layer 4 on the pixel resin layer 3; and forming the first inorganic cover layer 5 on the first planarization layer 4.

In some embodiments, the method for producing the color filter (CF) substrate 100 further comprises forming a spacer 6 on the first inorganic cover layer. In some embodiments, the spacer 6 is a columnar spacer.

An example of the present disclosure relates to a display panel, which comprises an array substrate and a color filter (CF) substrate, wherein, the CF substrate comprises a first base substrate 1; a black matrix 2 and a pixel resin layer 3 both formed on the first base substrate 1; a first planarization layer 4 formed on the black matrix 2 and the pixel resin layer 3; and a first inorganic cover layer 5 formed on the first planarization layer 4.

In some embodiments of the display panel, the array substrate comprises: a second base substrate 20; a switch element 21 arranged on the second base substrate 20; a second planarization layer 22 arranged on the switch element 21; a second inorganic cover layer 23 arranged on the second planarization layer 22; and an electrode 24 arranged on the second inorganic cover layer. The second planarization layer 22 is typically made of a similar organic material as that in the first planarization layer. The first inorganic cover layer 5 arranged on the first planarization layer 4 of the color filter (CF) substrate 100 and the second inorganic cover layer 23 in the second planarization layer 22 of the array substrate 200 of the display panel can decrease the amount of the gases released from the array substrate and the CF substrate, thereby further reducing the evacuation time during the cell-assembling process of the display panel and further improving the cell-assembling efficiency. Meanwhile, the gases remained inside the liquid crystal cell is further reduced, thereby further reducing the occurrence of afterimages in the display device and decreasing the amount of air bubbles at the four corners of the display device. Furthermore, the possibility of the contamination of the liquid crystals is further decreased, thereby further decreasing the possibility of the occurrence of Zara defects (point defects).

Embodiment 1

Hereinafter, a color filter (CF) substrate according to an embodiment of the present disclosure and a method for producing the same are illustrated with reference to FIGS. 2-6.

FIG. 2 shows a color filter (CF) substrate 100, which comprises: a first base substrate 1; a black matrix 2 and a pixel resin layer 3 both formed on the first base substrate 1; a first planarization layer 4 formed on the black matrix 2 and the pixel resin layer 3; and a first inorganic cover layer 5 formed on the first planarization layer 4.

In some examples, the first inorganic cover layer is an inorganic PVX layer (passivation layer).

In some examples, the first inorganic cover layer is made of an inorganic nonmetallic material; or oxides or nitrides of metals or nonmetals. The specific nonmetallic material may be silicon. The metal oxide layer may be nonconductive metal oxide, such as copper oxide, etc. The nonmetallic oxide may be silicon dioxide. Nitrides such as silicon nitride may also be used as the first inorganic cover layer.

In some examples, the first inorganic cover layer comprises: amorphous silicon layer, polysilicon layer, $SiN_x$ layer, $SiO_2$ layer, $SiN_yO_z$ layer or the combination thereof. Herein, the value of x may be 4/3 or within 4/3±1/3. Furthermore, the relation between y and z may be varied as long as $3y+2z=4$, or the relation between y and z may also be such that the variation from "$3y+2z=4$" does not exceed 20%, that is, y is within $(4-2z)/3\pm20\%$ or z is within $(4-3y)/2\pm20\%$.

In some examples, the first inorganic cover layer has a thickness of 50-1000 nm. The thickness of the inorganic cover layer may be determined according to requirement as long as the gases released from the pixel resin layer and the first planarization layer can be greatly inhibited from passing through and escaping from the inorganic cover layer. In some examples, the first inorganic cover layer has a thickness of 200-800 nm, for example, 400-600 nm.

In some examples, when the first inorganic cover layer contains a $SiN_x$ layer, the $SiN_x$ layer has a density of 3.2-3.5 g/cm³. The denser $SiN_x$ layer can greatly inhibit the gases released from the pixel resin layer and the first planarization layer from passing through and escaping from the inorganic cover layer. When the thickness of the $SiN_x$ layer reaches 100-200 nm, the $SiN_x$ layer can substantially prevent the escape of micromolecular gases.

In some examples, when the first inorganic cover layer contains a $SiO_2$ layer, the $SiO_2$ layer has a density of 2.0-2.4 g/cm³. The denser $SiO_2$ layer can greatly inhibit the gases released from the pixel resin layer and the first planarization layer from passing through and escaping from the inorganic cover layer. When the thickness of the $SiO_2$ layer reaches 200-400 nm, the $SiO_2$ layer can substantially prevent the escape of micromolecular gases.

In some examples, the pixel resin layer 3 comprises a red pixel resin layer, a green pixel resin layer, a blue pixel resin layer and optionally a transparent pixel resin layer.

In some examples, the first planarization layer is made of a acrylic resin.

Figure 6:
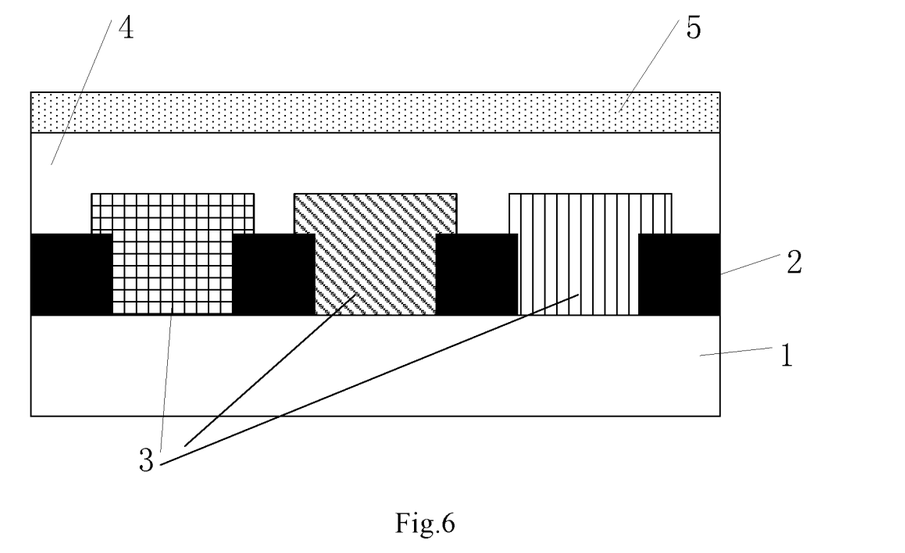

In some examples, as shown in FIG. 6, the CF substrate further comprises a common electrode 7 formed on the first inorganic cover layer. The common electrode 7 is optionally formed on the color filter substrate, and the shape of the common electrode is also not specifically limited. The common electrode may be a tabular electrode, a comb-shaped electrode or an electrode of any other feasible shape. The common electrode is generally a transparent electrode, such as ITO.

In some examples, the CF substrate 100 further comprises a columnar spacer 6 formed on the first planarization layer 4. When a common electrode 7 is formed, the columnar spacer 6 may be formed on the common electrode.

The method for producing the color filter (CF) substrate of this embodiment may comprise Step 101, Step 102, Step 103, Step 104, Step 105, and Step 106 as described hereafter.

Figure 3:
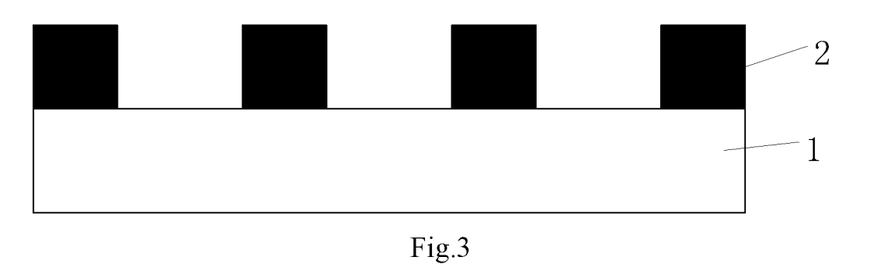
FIGS. 3-6 illustrate a manufacturing process of a color filter substrate according to an embodiment of the present disclosure.

Step 101 (as shown in FIG. 3): forming the black matrix on the first base substrate such that a pixel zone is surrounded by the black matrix.

Generally, the area on the color filter (CF) substrate (or the first base substrate) may be divided into a pixel zone and a nonpixel zone. The area forming the black matrix corresponds to the nonpixel zone.

The first base substrate may be a glass substrate or other transparent material substrate. A black matrix material layer made of photoresist is spin-coated or knife-coated on a glass substrate. The substrate is exposed by using a mask plate which is carved with a pattern, and then the exposed substrate is developed to obtain a black matrix pattern, wherein, the black matrix pattern has a thickness of 1-5 μm.

The method for producing the black matrix is not limited, such as the black matrix may also be produced by using a vacuum depositing method.

Figure 4:
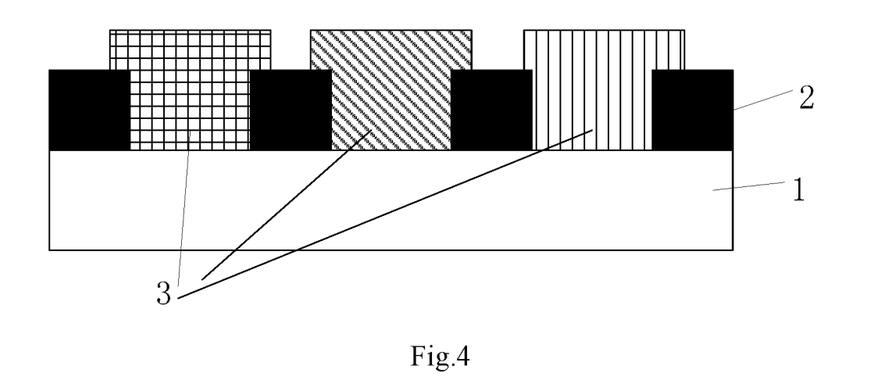

Step 102 (as shown in FIG. 4): forming the pixel resin layer 3 between the black matrix 2.

The pixel resin layer 3 may contains pixel resin layers of various colors, such as red pixel resin layer, green pixel resin layer, and blue pixel resin layer; or may also contains a transparent pixel resin layer, thus the pixel resin layers of various colors are usually required to be formed separately. The thickness of the pixel resin layer may be 1.0-1.3 μm.

Firstly, adding and dispersing a solvent which can be miscible with a pixel resin material into the pixel resin material.

In some embodiments, the solvent is a low-boiling point solvent which has a boiling point of lower than 70° C. at atmospheric pressure. For example, ethanol, diethyl ether, pentane, acetone or chloroform may be used.

Secondly, coating the pixel resin material added with the solvent onto the first base substrate formed with the black matrix.

Thirdly, heat-treating the first base substrate coated with the pixel resin material to evaporate the solvent dispersed in the pixel resin material. This heat treatment is the prebaking step in the photolithography process. The heat treatment temperature may be 90-110° C., and the heat treatment duration may be 3-5 min.

Fourthly, exposing the heat-treated substrate by using a mask plate which is carved with a pattern, developing and heat-treating to form the pattern of the pixel resin layer.

As for the pixel resin layers of various colors, the above steps are repeated to obtain the whole pixel resin layer. The method for producing the pixel resin layer is not limited to the method illustrated above, and the pixel resin layer may be produced by dyeing, printing, electrodepositing or ink-jet method.

Figure 5:
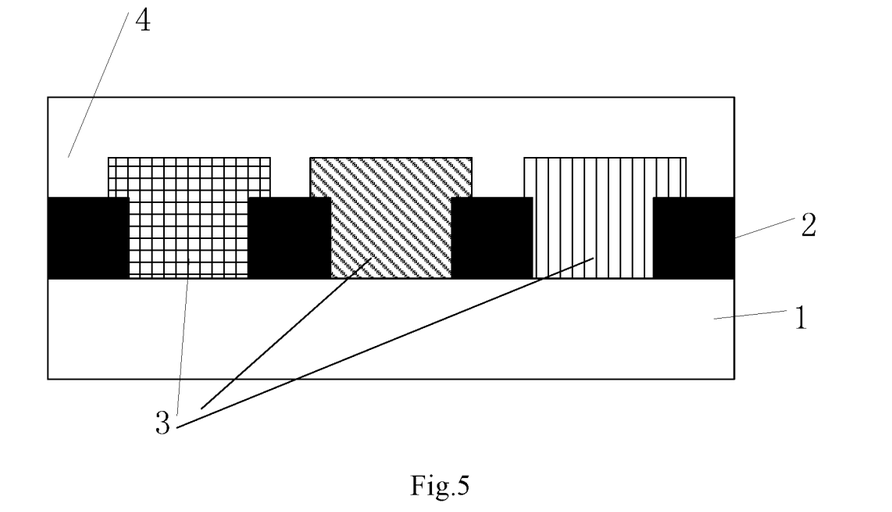

Step 103 (as shown in FIG. 5): forming the first planarization layer 4 on the substrate after step 102 is completed.

The first planarization layer 4 can be formed by using coating, baking or other process. The first planarization layer 4 is made of an organic material. Generally, the first planarization layer 4 is transparent and used for protecting the pixel resin layer from wear and tear, improving heat resistance thereof and planarizing the surface thereof. Therefore, the first planarization layer 4 may be also referred to as an overcoat.

The specific forming steps of the first planarization layer 4 may be: coating a layer of a photosensitive organic resin material on the first base substrate which is formed with the pixel resin layer; and curing the same. Specifically, the photosensitive organic resin material may be a positive photoresist or a negative photoresist. The method for curing the photosensitive organic resin material may be determined according to the material. For example, a negative photoresist may be cured by illumination. Conventional positive photoresists are such as BP212 series which are used widely, while conventional negative photoresists are such as SU 8 series which are also used widely. Those which also can be listed are: DONGJIN positive photoresists of DSAM3037, DSAM3020 and other series; DONGJIN negative photoresists of DNR-L300D1 and other series.

Step 104 (as shown in FIG. 6): forming the first inorganic cover layer 5 on the first planarization layer 4.

A $SiO_2$ layer is formed on the surface of the first planarization layer 4 by using chemical vapor deposition (CVD) method. The $SiO_2$ layer has a thickness of 300 nm and a density of 1.9 to less than 2.0 g/cm$^3$. In the present application, the evacuation time by using an ODF (One Drop Fill) device (service condition: 1.0 Pa/30 s, the following are the same) is used for assessing the capacity of an inorganic cover layer for preventing the escape of micromolecular gases. By the ODF device test, the ODF time is 50 s when the inorganic cover layer used is produced by this method.

In one example, a SiNx layer is formed on the surface of the first planarization layer 4 by low pressure chemical vapor deposition (LPCVD) method. The SiNx layer has a thickness of 200 nm and a density of 3.2-3.5 g/cm$^3$. By the ODF device test, the ODF time is 56 s when the inorganic cover layer used is produced by this method.

In one example, an amorphous silicon layer having a thickness of 300 nm is formed on the surface of the first planarization layer 4 by sputtering or magnetron sputtering method. Then the amorphous silicon film is irradiated by using a laser at a hydrogen-free condition to crystallize the film, thereby obtaining a polysilicon film having a thickness of 300 nm. By the ODF device test, the ODF time is 42 s when the inorganic cover layer used is produced by this method.

In one example, amorphous silicon layer having a thickness of 300 nm is formed on the surface of the first planarization layer 4 by CVD method. The amorphous silicon is crystallized by using an excimer laser. The surface of the sample is treated by 1% (volume) of HF, and then the sample is placed in a dry pure oxygen atmosphere where the volume content of oxygen gas is more than 98% and the volume content of water is less than 10 ppm, and scanned by a near infrared excimer laser of a high energy density (100-500 mJ·cm$^{-2}$), thereby forming a dense $SiO_2$ film of about 300 nm. The $SiO_2$ film formed by this method has a dense structure, a density of 2.0-2.4 g/cm$^3$, and an excellent gas barrier capability. By the ODF device test, the ODF time is 45 s when the inorganic cover layer used is produced by this method.

In one example, a SiNx layer having a thickness of 300 nm and a $SiO_2$ layer having a thickness of 100 nm is formed on the surface of the first planarization layer 4 as buffer layers by CVD method, and then amorphous silicon of 200 nm is deposited. The amorphous silicon is crystallized by using an excimer laser. After that, the surface of the sample is treated by 1% (volume) of HF, and then the sample is placed in a dry pure oxygen atmosphere where the volume content of oxygen gas is more than 98% and the volume content of water is less than 10 ppm, and scanned by a near infrared excimer laser of a high energy density of 100-500 mJ·cm$^{-2}$, thereby forming a dense $SiO_2$ film having a thickness of about 200 nm. The $SiO_2$ film formed by this method has a dense structure, a density of 2.0-2.4 g/cm$^3$, and an excellent gas barrier capability. Furthermore, a combination of various organic material layers are used, the gas barrier capability of the obtained organic cover layer 5 may be further improved by using this design. By the ODF device test, the ODF time is 36 s when the inorganic cover layer used is produced by this method.

In one example, a SiNx having a thickness of 50 nm and a $SiO_2$ having a thickness of 100 nm are successively deposited on the surface of the first planarization layer 4 as buffer layers by CVD method, and then amorphous silicon of 200 nm is deposited. The amorphous silicon is crystallized by using an excimer laser. After that, the surface of the sample is treated by 1% (volume) of HF, and then the sample is scanned by a near infrared excimer laser of a energy density of 100-500 mJ·cm$^{-2}$ in an atmosphere containing $NH_3$, thereby growing up a SiNx film of 100 nm. The SiNx film formed by this method has a high compactness and a density of 3.2-3.5 g·cm$^{-3}$. By the ODF device test, the ODF time is 58 s when the inorganic cover layer used is produced by this method.

Figure 7:
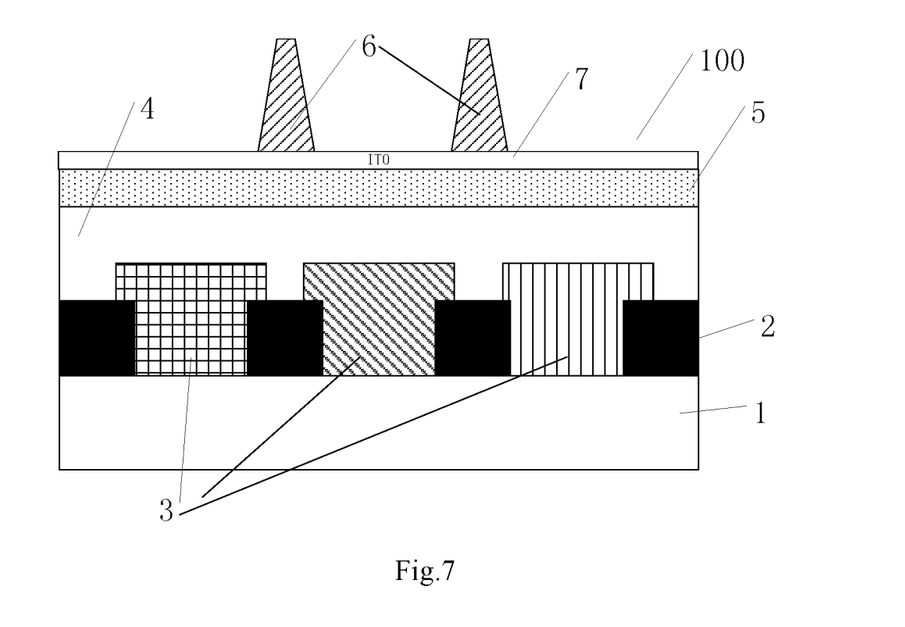
FIG. 7 is a schematic view of another color filter substrate according to an embodiment of the present disclosure.

Step 105 (an optional step): forming a common electrode 7 on the first base substrate after step 104 is completed.

The common electrode can be formed by depositing or electroplating method (as shown in FIG. 7). The common electrode 7 may be a transparent conductive layer of 500-2000 Å. It needs to be noted that the common electrode has not to be arranged on the color filter substrate, thus the step of forming a common electrode on the color filter substrate is optional.

Step 106: forming a columnar spacer 6 on the first base substrate after step 104 or 105 is completed.

The columnar spacer 6 can be formed by photolithography process. Specifically, a columnar spacer layer made of photoresist is coated on the first base substrate after step 104 or 105 is completed. After exposure and development processes, the columnar spacer 6 is finally formed. The columnar spacer has a cross sectional diameter of 15-20 μm at the connection with the underlying layer, and has a cross sectional diameter of 5-10 μm on the free end. The columnar spacer may have a height of 5-10 μm (as shown in FIG. 2 or FIG. 7).

In a further step, the color filter (CF) substrate obtained in step 106 may be produced into a display panel. Therefore, this embodiment further provides a liquid crystal display panel, which comprises an array substrate, the color filter (CF) substrate obtained in step 106, and liquid crystals filled between the array substrate and the color filter.

The inventors of the present application have found that using the first inorganic cover layer on the color filter (CF) substrate may effectively prevent gases from delivering from the pixel resin layer 3 and the first planarization layer 4, thereby reducing the evacuation time during the cell-assembling process and improving the cell-assembling efficiency. Meanwhile, the gases remained inside the liquid crystal cell will be reduced, thereby reducing the occurrence of after-images in the display device and decreasing the amount of air bubbles at the four corners of the display device. Furthermore, the possibility of the contamination of the liquid crystals is decreased, thereby decreasing the possibility of the occurrence of Zara defects (point defects). The lower the water vapor transmission rate of the first inorganic cover layer is, the better the above effects are.

Embodiment 2

Hereinafter, a display panel according to an embodiment of the present disclosure is illustrated with reference to FIGS. 8 and 9. It needs to be noted that the structure of the display panel is illustrated merely in the part between the curves I and II in FIGS. 8 and 9 and remaining parts are not specifically shown in FIGS. 8 and 9.

Figure 8:
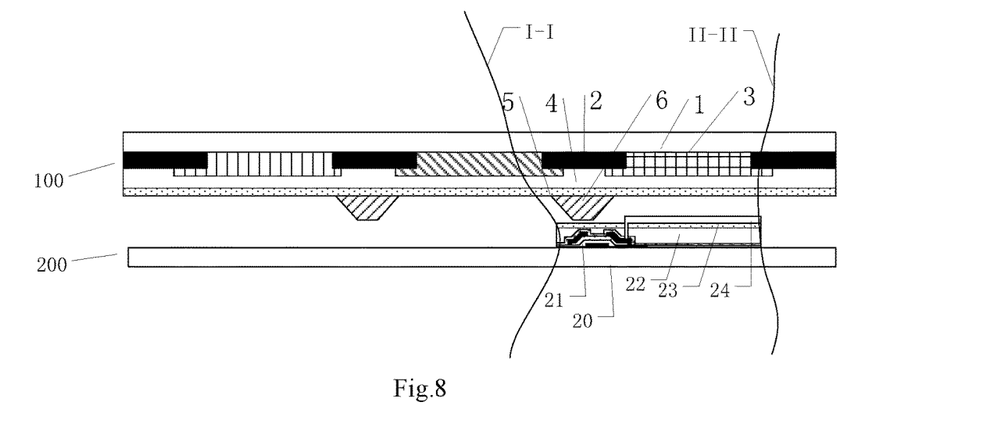
FIG. 8 is a schematic view of a display panel according to an embodiment of the present disclosure.

As shown in FIG. 8, a display panel comprises an array substrate 200 and a color filter (CF) substrate 100, wherein, the CF substrate comprises a first base substrate 1; a black matrix 2 and a pixel resin layer 3 both formed on the first base substrate 1; a first planarization layer 4 formed on the black matrix 2 and the pixel resin layer 3; and a first inorganic cover layer 5 formed on the first planarization layer 4. The color filter (CF) substrate 100 herein may be the same as that in Embodiment 1, and the production method thereof may be also the same.

Figure 9:
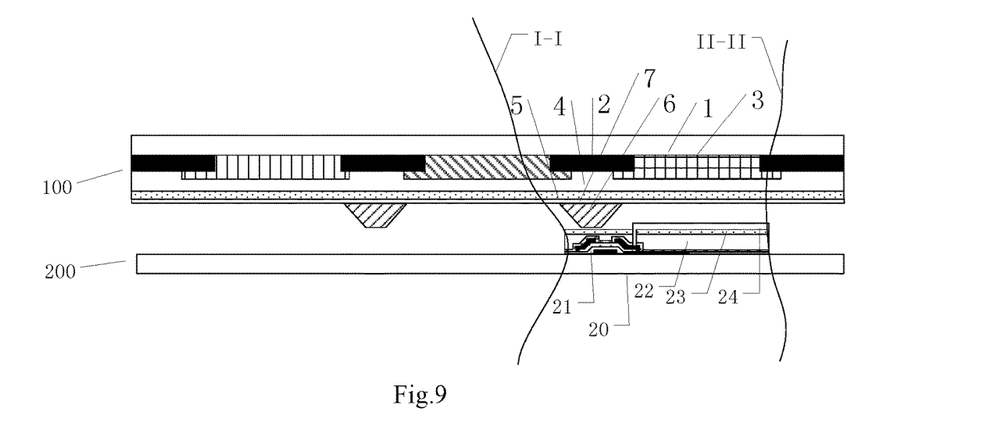
FIG. 9 is a schematic view of another display panel according to an embodiment of the present disclosure.

In one example (as shown in FIGS. 8 and 9), the array substrate comprises: a second base substrate 20; a switch element 21 arranged on the second base substrate 20; a second planarization layer 22 arranged on the switch element 21; a second inorganic cover layer 23 arranged on the second planarization layer 22; and an electrode 24 arranged on the second inorganic cover layer 23.

The second inorganic cover layer may be made of an inorganic nonmetallic material; or oxides or nitrides of metals or nonmetals. The specific nonmetallic material may be silicon. The metal oxide layer may be nonconductive metal oxide, such as copper oxide, etc. The nonmetallic oxide may be silicon dioxide. Nitrides such as silicon nitride may also be used as the second inorganic cover layer.

In some examples, the second inorganic cover layer comprises: amorphous silicon layer, polysilicon layer, $SiN_x$ layer, $SiO_2$ layer, $SiN_yO_z$ layer or the combination thereof.

In some examples, the second inorganic cover layer has a thickness of 50-1000 nm. In some examples, the second inorganic cover layer has a thickness of 200-800 nm or 400-600 nm.

In some examples, when the second inorganic cover layer contains a $SiN_x$ layer, the $SiN_x$ layer has a density of 3.2-3.5 g/cm$^3$. The denser $SiN_x$ layer can greatly inhibit the gases released from the second planarization layer from passing through and escaping from the second inorganic cover layer. When the thickness of the $SiN_x$ layer reaches 100-200 nm, the $SiN_x$ layer can substantially prevent the escape of micromolecular gases.

In some examples, when the second inorganic cover layer contains a $SiO_2$ layer, the $SiO_2$ layer has a density of 2.0-2.4 g/cm$^3$. The denser $SiO_2$ layer can greatly inhibit the gases released from the second planarization layer from passing through and escaping from the second inorganic cover layer. When the thickness of the $SiO_2$ layer reaches 200-400 nm, the $SiO_2$ layer can substantially prevent the escape of micromolecular gases.

A second inorganic cover layer is also arranged on the second planarization layer on one side of the array substrate, which can further reduce the evacuation time during the cell-assembling process of the display panel and further improve the cell-assembling efficiency. Meanwhile, the gases remained inside the liquid crystal cell is further reduced, thereby further reducing the occurrence of after-images in the display device and decreasing the amount of air bubbles at the four corners of the display device. Furthermore, the possibility of the contamination of the liquid crystals is further decreased, thereby further decreasing the possibility of the occurrence of Zara defects (point defects).

In some examples, the display panel further comprises a liquid crystal layer arranged between the array substrate 200 and the color filter (CF) substrate 100.

In one example, the electrode arranged on the second inorganic cover layer comprises a common electrode and a pixel electrode, and the CF substrate is provided with or without a common electrode thereon.

In one example, the electrode arranged on the second inorganic cover layer comprises a pixel electrode, and the CF substrate further comprises a common electrode arranged on the first inorganic cover layer (as shown in FIG. 9).

The method for producing the display panel of this embodiment comprises the following steps:

A color filter (CF) substrate is prepared as stated in Embodiment 1.

A switch element 21 is formed on the second base substrate 20. The switch element is a thin film transistor. The thin film transistor has the following structure: a gate, a gate insulation layer, a semiconductor layer, a source, a drain, a passivation layer, etc.

A second planarization layer 22 is formed on the switch element. The method for forming the second planarization layer 22 may be the same as the method for forming the first planarization layer 4. The thickness of the second planarization layer may be, but not be limited to, 0.8-3 μm.

A second inorganic cover layer 23 is formed on the second planarization layer 22. The method for forming the second inorganic cover layer may be the same as the method for forming the first inorganic cover layer 5.

A throughhole which passes through the second inorganic cover layer 23, the second planarization layer 22 and the passivation layer of the switch element is formed by etching process to expose the output electrode, such as the drain electrode, of the switch element.

A transparent electrode layer is formed on the second base substrate by chemical vapor deposition method, and an electrode pattern is formed by etching process. The electrode pattern may be a pixel electrode or both of a pixel electrode and a common electrode.

After that, the display panel is formed by cell-assembling process.

In this embodiment, the first inorganic cover layer 5 arranged on the first planarization layer 4 of the color filter (CF) substrate 100 and the second inorganic cover layer 23 in the second planarization layer 22 of the array substrate 200 of the display panel can decrease the amount of the gases released from the array substrate and the CF substrate, thereby further reducing the evacuation time during the cell-assembling process of the display panel and further improving the cell-assembling efficiency. Meanwhile, the gases remained inside the liquid crystal cell is further reduced, thereby further reducing the occurrence of after-images in the display device and decreasing the amount of air bubbles at the four corners of the display device. Furthermore, the possibility of the contamination of the liquid crystals is further decreased, thereby further decreasing the possibility of the occurrence of Zara defects (point defects). In this embodiment, when the display panel of this embodiment is prepared, the evacuation time is steadily 32-40 s by using an ODF (One Drop Fill) device (service condition: 0.5 Pa/10 s) during cell-assembling.

The above description is merely exemplary embodiments which are not used for limiting the scope of protection of the present disclosure which is, however, determined by the attached claims.

What is claimed is:

1. A color filter substrate, comprising:
a base substrate;
a black matrix and a pixel resin layer, both formed on the base substrate;
a planarization layer formed on the black matrix and the pixel resin layer to reduce a stage difference of the pixel resin layer; and
an inorganic cover layer formed on the planarization layer to prevent gas releasing from the pixel resin layer and the planarization layer,
wherein the inorganic cover layer is in direct contact with the planarization layer,
the inorganic cover layer consists of one or more layers selected from the group consisting of an amorphous silicon layer, a polysilicon layer, a $SiN_x$ layer, a $SiO_2$ layer, a $SiN_yO_z$ layer and a combination thereof, wherein x is 4/3 or within a range of 4/3±1/3, 3y+2z=4 or a variation from "3y+2z=4" does not exceed 20%, and
the planarization layer is made of an acrylic resin.

2. The color filter substrate as defined according to claim 1, wherein the inorganic cover layer has a thickness of 50-1000 nm.

3. The color filter substrate as defined according to claim 1, wherein the $SiN_x$ layer has a density of 3.2-3.5 g/cm$^3$.

4. The color filter substrate as defined according to claim 1, wherein the $SiO_2$ layer has a density of 2.0-2.4 g/cm$^3$.

5. The color filter substrate as defined according to claim 1, wherein the pixel resin layer comprises a red pixel resin layer, a green pixel resin layer, a blue pixel resin layer and optionally, a transparent pixel resin layer.

6. The color filter substrate as defined according to claim 1, further comprising a common electrode formed on the inorganic cover layer.

7. A display panel, comprising an array substrate and a color filter substrate, wherein the color filter substrate comprises:
a first base substrate;
a black matrix and a pixel resin layer, both formed on the first base substrate;
a first planarization layer formed on the black matrix and the pixel resin layer to reduce a stage difference of the pixel resin layer; and
a first inorganic cover layer formed on the first planarization layer to prevent gas releasing from the pixel resin layer and the first planarization layer,
wherein the first inorganic cover layer is in direct contact with the first planarization layer,
the first inorganic cover layer consists of one or more layers selected from the group consisting of a Si layer, a $SiN_x$ layer, a $SiO_2$ layer, a $SiN_yO_z$ layer or a combination thereof, wherein x is 4/3 or within a range of 4/3±1/3, 3y+2z=4 or a variation from "3y+2z=4" does not exceed 20%, and
the first planarization layer is made of an acrylic resin.

8. The display panel as defined according to claim 7, wherein the array substrate further comprises:
a second base substrate;
a switch element arranged on the second base substrate;
a second planarization layer arranged on the switch element;
a second inorganic cover layer arranged on the second planarization layer; and
an electrode arranged on the second inorganic cover layer.

9. The display panel as defined according to claim 8, wherein the electrode arranged on the second inorganic cover layer comprises at least one selected from the group consisting of a common electrode and a pixel electrode.

10. The display panel as defined according to claim 8, wherein the electrode arranged on the second inorganic cover layer comprises a pixel electrode, and the color filter substrate further comprises a common electrode arranged on the first inorganic cover layer.

11. The display panel as defined according to claim 7, wherein the first inorganic cover layer has a thickness of 50-1000 nm.

12. The display panel as defined according to claim 7, wherein the $SiN_x$ layer has a density of 3.2-3.5 g/cm$^3$.

13. The display panel as defined according to claim 7, wherein the $SiO_2$ layer has a density of 2.0-2.4 g/cm$^3$.

14. The display panel as defined according to claim 8, wherein the second inorganic cover layer comprises at least one selected from the group consisting of: a Si layer, a $SiN_x$ layer, a $SiO_2$ layer, a $SiN_yO_z$ layer or a combination thereof, wherein x is 4/3 or within a range of 4/3±1/3, 3y+2z=4 or a variation from "3y+2z=4" does not exceed 20%.

15. A method for producing a color filter substrate, comprising:
forming a black matrix on a base substrate;
forming a pixel resin layer between the black matrix;
forming a planarization layer on the pixel resin layer to reduce a stage difference of the pixel resin layer; and
forming an inorganic cover layer on the planarization layer to prevent gas releasing from the pixel resin layer and the planarization layer,
wherein the inorganic cover layer is in direct contact with the planarization layer,
the planarization layer is made of an acrylic resin, and
wherein the inorganic cover layer is formed by any one of the following procedures:
a. depositing an amorphous silicon layer of a thickness of 50-1000 nm, and converting all or at least a part of the amorphous silicon layer into a polysilicon layer; and
b. depositing an amorphous silicon layer of a thickness of 50-1000 nm, and converting all or at least a part of the amorphous silicon layer into a $SiO_2$ layer, a $SiN_x$ layer and/or a $SiN_yO_z$ layer, wherein x is 4/3 or within a range of 4/3±1/3, 3y+2z=4 or a variation from "3y+2z=4" does not exceed 20%.

* * * * *